(12) United States Patent
Ishikawa et al.

(10) Patent No.: US 8,278,878 B2
(45) Date of Patent: Oct. 2, 2012

(54) VOLTAGE DETECTION APPARATUS

(75) Inventors: Satoshi Ishikawa, Makinohara (JP);
Kimihiro Matsuura, Makinohara (JP);
Ryosuke Kawano, Saiki (JP)

(73) Assignee: Yazaki Corporation, Tokyo (JP)

( * ) Notice: Subject to any disclaimer, the term of this patent is extended or adjusted under 35 U.S.C. 154(b) by 515 days.

(21) Appl. No.: 12/505,754

(22) Filed: Jul. 20, 2009

(65) Prior Publication Data
US 2010/0060256 A1    Mar. 11, 2010

(30) Foreign Application Priority Data
Sep. 9, 2008  (JP) ................................. 2008-230634

(51) Int. Cl.
*H02J 7/00* (2006.01)

(52) U.S. Cl. ....................................... 320/116; 324/426

(58) Field of Classification Search ................... 320/116
See application file for complete search history.

(56) References Cited

U.S. PATENT DOCUMENTS

| | | | |
|---|---|---|---|
| 6,762,588 B2 * | 7/2004 | Miyazaki et al. | 320/116 |
| 7,091,695 B2 * | 8/2006 | Miyazaki et al. | 320/116 |
| 7,489,112 B2 * | 2/2009 | Ishikawa et al. | 320/161 |
| 7,573,238 B2 * | 8/2009 | Kawai | 320/132 |
| 2006/0273802 A1 | 12/2006 | Murakami et al. | |
| 2007/0170889 A1 * | 7/2007 | Ishikawa et al. | 320/116 |

FOREIGN PATENT DOCUMENTS

JP  2003-243044 A  8/2003

* cited by examiner

*Primary Examiner* — Ramy Ramadan
(74) *Attorney, Agent, or Firm* — Sughrue Mion, PLLC

(57) ABSTRACT

A voltage detection apparatus includes: a battery including a plurality of unit cells mutually connected in series; a plurality of blocks, each block including at least one of the plurality of unit cells; a plurality of voltage detectors, each detector connected to respective one of the blocks, and detecting a voltage between both ends of the unit cell in the one of the blocks; a plurality of reference power sources, each source connected to respective one of the voltage detectors, and at least one of the reference power sources having higher accuracy than the other reference power sources; and a correcting unit which corrects a detection result of the voltage detector which is connected to the other reference power source on the basis of a detection result of the voltage detector which is connected to the reference power source with the higher accuracy.

5 Claims, 3 Drawing Sheets

VOLTAGE DETECTION APPARATUS

BACKGROUND OF THE INVENTION

1. Technical Field

The present invention relates to a voltage detection apparatus, and particularly to a voltage detection apparatus for detecting a voltage of a vehicle-mounted high-voltage battery made of plural unit cells mutually connected in series.

2. Background Art

In recent years, a hybrid vehicle (hereinafter called HEV: Hybrid Electric Vehicle) traveling with a combination of an engine and an electric motor has become widespread. This HEV includes two kinds of batteries of a low-voltage battery of about 12 V for starting of the engine and a high-voltage battery for driving of the electric motor. The high-voltage battery described above obtains a high voltage by using a secondary battery such as a nickel-hydrogen battery or a lithium battery as a unit cell including at least one or more cells or secondary batteries and connecting the plural unit cells in series.

While the high-voltage battery described above repeats charge and discharge, variations occur in a voltage between both ends of each of the secondary batteries, that is, a state of charge (SOC). In the case of charge and discharge of the battery, it is necessary to prohibit charge at a point in time when the secondary battery with the highest SOC (or voltage between both ends) reaches a set upper limit SOC (or upper limit voltage value between both ends) and prohibit discharge at a point in time when the secondary battery with the lowest SOC (or voltage between both ends) reaches a set lower limit SOC (or lower limit voltage value between both ends) from the standpoint of ensuring of safety or durability of each of the secondary batteries. Therefore, when variations in the SOC occur in each of the secondary batteries, a usable capacity of the battery decreases substantially. As a result of this, in the HEV, the so-called assist and regeneration, in which battery energy is replenished with respect to gasoline at the time of ascent or energy is regenerated in the battery at the time of descent, become insufficient and actual vehicle power performance or fuel consumption is reduced. Hence, it is necessary to detect a voltage between both ends of each of the secondary batteries in order to equalize the SOC of each of the secondary batteries.

An apparatus as shown in JP-A-2003-243044 is proposed as a voltage detection apparatus for detecting a voltage between both ends of each of the secondary batteries constructing the high-voltage battery described above. The voltage detection apparatus of JP-A-2003-243044 divides the high-voltage battery into plural modules and detects a voltage between both ends of each of the secondary batteries of the inside of each of the modules by a CPU etc. arranged every module. By being constructed thus, voltages between both ends of plural secondary batteries can be simultaneously detected and also a withstand voltage of a device used for detecting the voltage between both ends can be decreased.

In the voltage detection apparatus described above, a detection error occurs between modules due to variations in accuracy of an A/D converter, a reference voltage, etc. used in detection of a voltage between both ends of each of the modules. When the detection error between the modules is large, an equalization error occurs in the case of equalizing the SOC of each of the secondary batteries, so that each of the secondary batteries could not be used efficiently. When an A/D converter or a reference voltage with high accuracy is used, this error can be eliminated, but there was a problem that the A/D converter or the reference voltage with high accuracy is required by the number of modules divided and a cost increases.

A voltage correction method described in US2006/0273802A is proposed as a method for correcting such an error. In the voltage correction method described in US2006/0273802A, an average value of measured values is calculated every each block and is set as a representative value of the block and its representative value is compared. When there is a difference between the representative values, its difference is corrected.

However, the voltage correction method described in US2006/0273802A had a problem that though the voltage detection itself is performed normally when the voltage itself of a block varies, a difference in voltage is corrected as an error, in other words, the difference is corrected as an error of a measurement system in an unknown state as to whether the voltage itself of the block varies or an error is the error of the measurement system.

SUMMARY OF THE INVENTION

The invention focuses attention on the problem as described above, and a problem of the invention is to provide a voltage detecting apparatus capable of correcting an error of a measurement result of voltage detector surely with high accuracy in the case of detecting a voltage of a block made of unit cells connected in series.

According to an aspect of the invention, there is provided a voltage detection apparatus, including: a battery including a plurality of unit cells mutually connected in series; a plurality of blocks, each block including at least one of the plurality of unit cells; a plurality of voltage detectors, each detector connected to respective one of the blocks, and detecting a voltage between both ends of the unit cell in the one of the blocks; a plurality of reference power sources, each source connected to respective one of the voltage detectors, and at least one of the reference power sources having higher accuracy than the other reference power sources; and a correcting unit which corrects a detection result of the voltage detector which is connected to the other reference power source on the basis of a detection result of the voltage detector which is connected to the reference power source with the higher accuracy.

In the above voltage detection apparatus, the correcting unit may correct a detection result of one of mutually-adjacent voltage detectors on the basis of a detection result of the other of the mutually-adjacent voltage detectors.

In the above voltage detection apparatus, the reference power source with the higher accuracy may be connected to one of the voltage detectors which is connected to a centrally-positioned block of the plurality of blocks.

In the above voltage detection apparatus, each of the voltage detectors may detect a voltage between both ends of the unit cell in adjacent one of the blocks, and the correcting unit may correct the detection result of the one of the mutually-adjacent voltage detectors on the basis of the detection result of the other of the mutually-adjacent voltage detectors using a common unit cell among the plurality of the unit cells.

According to the invention as described above, at least one or more reference power sources of the reference power sources have accuracy higher than the other reference power sources and a detection result of voltage detector connected to the other reference power source is corrected based on a detection result of voltage detector connected to high-accuracy reference power source. Thus, the detection result of the voltage detector connected to the other reference power source can be corrected based on the detection result with a small error by the voltage detector connected to the high-accuracy reference power source, and an error of the detection result of the voltage detector can be corrected surely with high accuracy.

According to the invention, correcting unit corrects a detection result of the other voltage detector based on a detection result of one voltage detector of the adjacent voltage detector, so that when a high-accuracy reference power source is disposed in one voltage detector, a correction can be made based on its high-accuracy reference power source and also when one voltage detector is corrected based on the voltage detector connected to the high-accuracy reference power source, a correction based on the high-accuracy reference power source can be made indirectly.

According to the invention, a high-accuracy reference power source is disposed in correspondence with voltage detector corresponding to a centrally positioned block of the plurality of blocks. Thus, the number of corrections to the voltage detector corresponding to the blocks of both ends becomes smaller than the case of disposing a reference power source of the voltage detector corresponding to the block of one end with high accuracy.

DETAILED DESCRIPTION OF THE PREFERRED EMBODIMENTS

Figure 1:
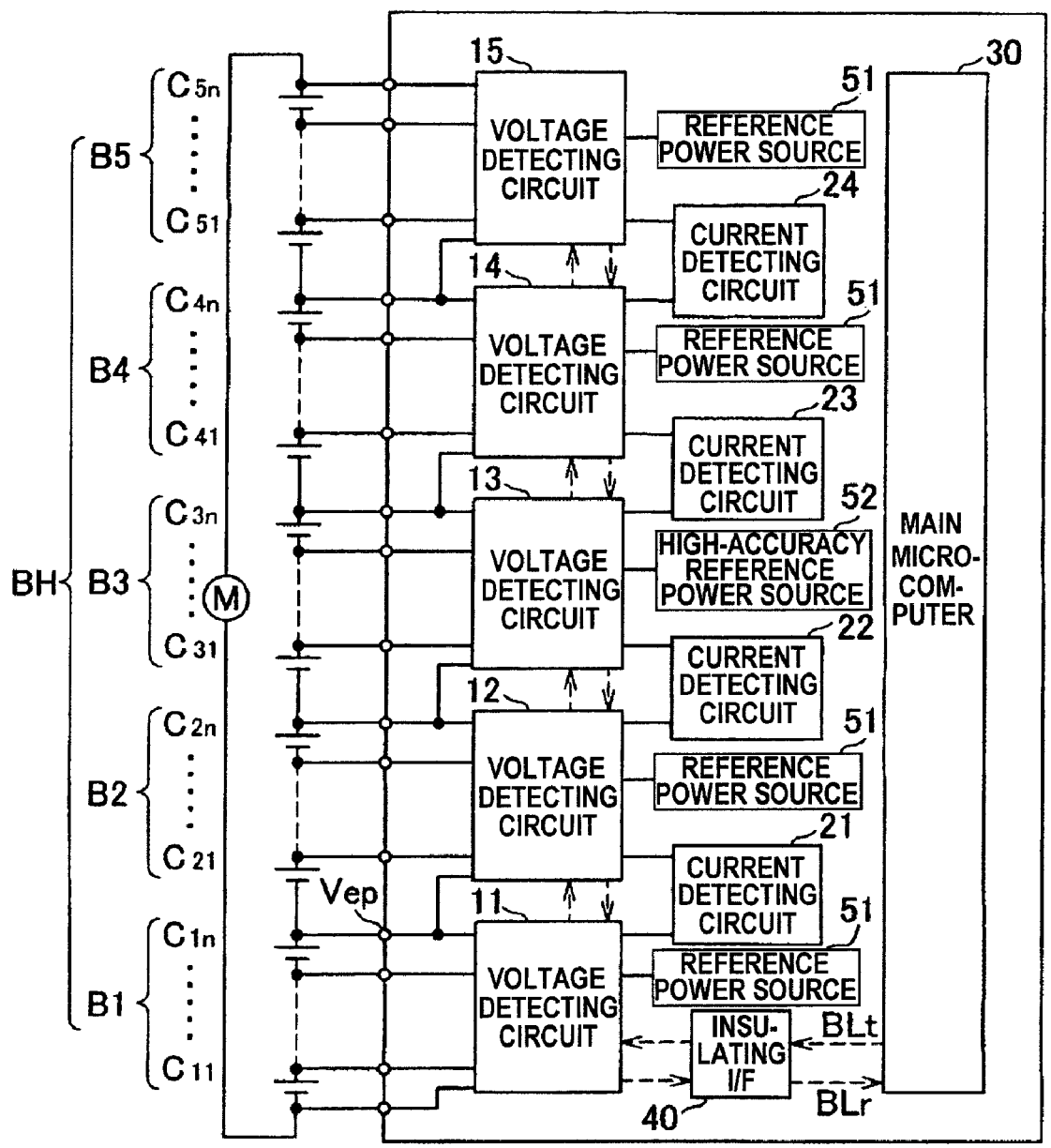
FIG. 1 is a circuit diagram showing a voltage detecting apparatus according to an embodiment of the invention.

An embodiment of the invention will hereinafter be described based on the drawings. FIG. 1 is a circuit diagram showing a voltage detection apparatus according to the embodiment of the invention. In FIG. 1, a high-voltage battery BH is provided. The high-voltage battery BH is used as a power source of an electric motor M in an HEV (Hybrid Electric Vehicle) for combining an engine and the electric motor M as a travel driving source, and the electric motor M is connected to both ends of the battery BH as a load as necessary and also an alternator etc. (not shown) are connected as a charger as necessary.

The high-voltage battery BH is divided into plural (five in the present embodiment) blocks B1 to B5. The number of blocks may be varied according to any conditions. The block B1 is constructed of n (n is any integer of 1 or more) unit cells C11 to C1n. The unit cells C11 to C1n are constructed of at least one or more secondary batteries. The other blocks B2 to B5 are similarly constructed of n unit cells.

The voltage detection apparatus includes voltage detecting circuits 11 to 15 as voltage detectors, current detecting circuits 21 to 24, a main microcomputer 30 as a correcting unit, and an insulating interface 40.

The voltage detecting circuits 11 to 15 are respectively disposed in correspondence with each of the blocks B1 to B5. The voltage detecting circuits 11 to 15 operate by receiving power source supply from the unit cells C11 to C1n constructing the corresponding blocks B1 to B5 among the plural blocks B1 to B5.

The voltage detecting circuits 11 to 15 respectively include a differential amplifier for detecting respective voltages between both ends of each of the unit cells C11 to C1n of the inside of the block and a value of a voltage between both ends of the whole corresponding block, a selective switch group for selectively connecting both ends of the unit cells C11 to C1n constructing each of the blocks B1 to B5 and both ends of each of the blocks B1 to B5 to the differential amplifier, an A/D converter for making digital conversion of a voltage between both ends detected by the differential amplifier, a controller for controlling the selective switch group, etc.

Also, the voltage detecting circuits 11 to 15 include a high-voltage system power source circuit for outputting a constant voltage resulting in an operating power source of the differential amplifier, the A/D converter and the controller from supply voltages of the corresponding blocks B1 to B5, and a breaking switch disposed between the differential amplifier and the A/D converter from the high-voltage system power source circuit. On-off of this breaking switch is controlled by the controller.

Further, a reference power source 51 or 52 is disposed in each of the voltage detecting circuits 11 to 15. The reference power source 51 or 52 is a high-voltage system power source circuit for outputting a constant voltage resulting in an operating power source of the A/D converter and the controller in the case of detecting a voltage between both ends of the unit cell or a voltage between both ends of the block. In this embodiment, the reference power sources 51 are disposed in the voltage detecting circuits 11, 12, 14, 15, and the high-accuracy reference power source 52 is disposed in the voltage detecting circuit 13 corresponding to the central block B3 of the plural blocks B1 to B5.

The high-accuracy reference power source 52 is a reference power source with higher accuracy of an outputted power source voltage than the other reference power sources 51, in other words, with small variations in the outputted power source voltage, and in the voltage detecting circuit 13 connected to this high-accuracy reference power source 52, an error in A/D conversion etc. becomes smaller as compared with the other voltage detecting circuits.

The main microcomputer 30 includes a memory and a CPU (not shown). Then, the CPU performs control etc. of the voltage detecting circuits 11 to 1m based on a control program etc. incorporated into the memory.

A bus line BLt for sending and a bus line BLr for receiving are disposed between the voltage detecting circuit 11 and the main microcomputer 30. Also, the insulating interface 40 is disposed on the bus line BLt for sending and the bus line BLr for receiving.

The insulating interface 40 is means for coupling the voltage detecting circuit 11 to the main microcomputer 30 in an electrically insulated state. The main microcomputer 30 and the voltage detecting circuit 11 can send and receive information in a mutually insulated state by the insulating interface 40. Consequently, insulation between the high-voltage battery BH and a low-voltage battery (not shown) for supplying a power source to the main microcomputer 30 can be maintained. As the insulating interface 40, for example, magnetic medium means such as a magnetic coupler or optical medium means such as a photocoupler made of a light emitting element and a light receiving element is publicly known.

Also, daisy chain connection of the voltage detecting circuits 11 to 15 is made in order of the voltage detecting circuits 11, 12, 13, 14, 15. The voltage detecting circuits 11 to 15 transmit its own detection result or a command, etc. from the main microcomputer 30 by communicating between the adjacent voltage detecting circuits.

The current detecting circuits 21 to 24 are disposed so as to make connection between the adjacent voltage detecting circuits. For example, the current detecting circuit 21 is disposed so as to make connection between the voltage detecting circuits 11 and 12. Similarly, the current detecting circuit 22 is disposed so as to make connection between the voltage detecting circuits 12 and 13 and the current detecting circuit 23 is disposed so as to make connection between the voltage detecting circuits 13 and 14 and the current detecting circuit 24 is disposed so as to make connection between the voltage detecting circuits 14 and 15. These have connection different from the daisy chain connection described above as shown in FIG. 1.

Figure 2:
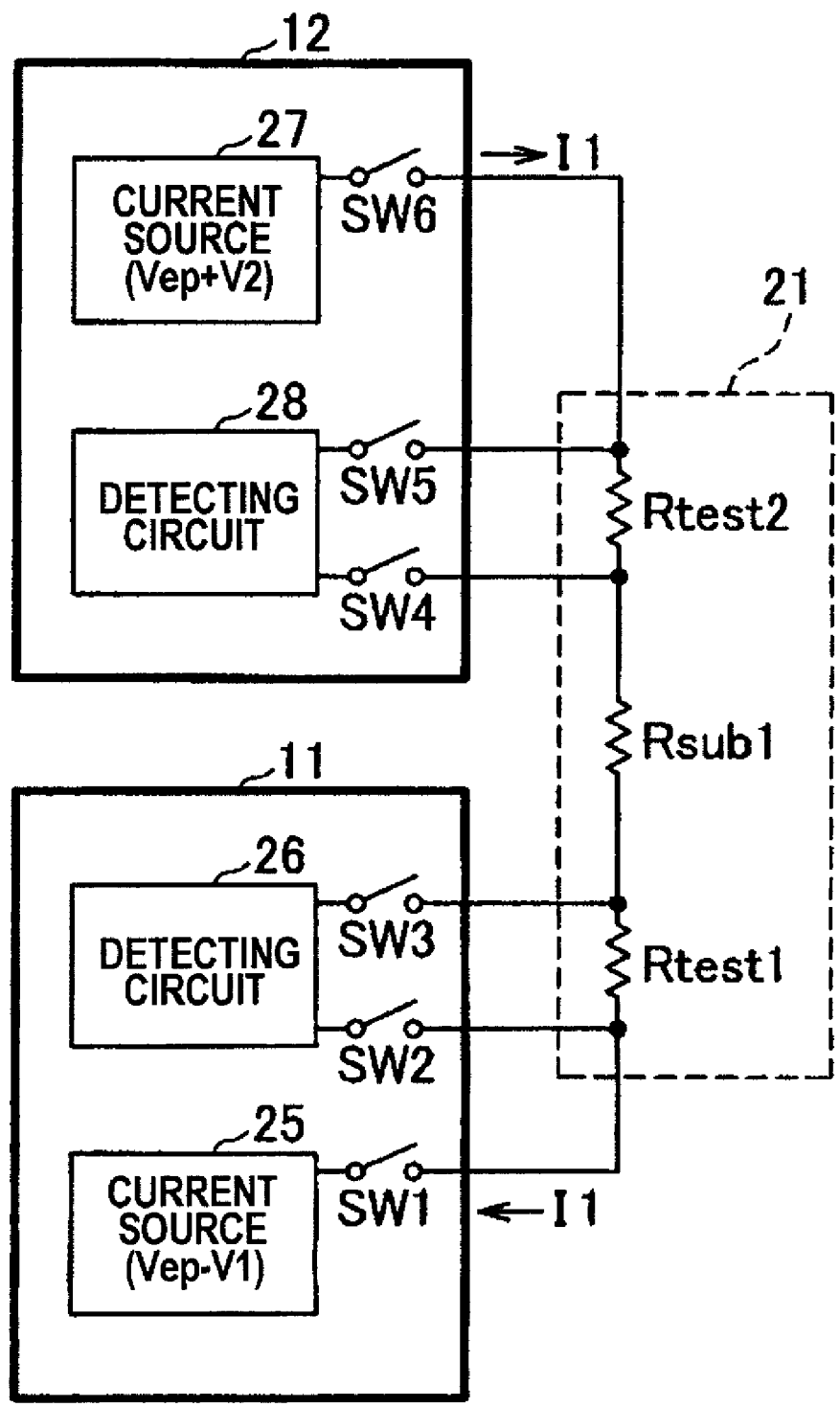
FIG. 2 is a circuit diagram of a current detecting circuit in the voltage detecting apparatus shown in FIG. 1.

The current detecting circuit 21 includes a resistor Rtest1 as a current detecting element, a resistor Rtest2 as a current detecting element and a resistor Rsub1 as a voltage regulating element as shown in FIG. 2. The resistor Rsub1 is connected between the resistor Rtest1 and the resistor Rtest2. All of the resistor Rtest1, the resistor Rsub1 and the resistor Rtest2 have the same resistance value. It is necessary that the resistor Rtest1 and the resistor Rtest2 have the same resistance value, but the resistor Rsub1 may have a resistance value different from that of the resistor Rtest1 and the resistor Rtest2. Though description will hereinafter be made in the current detecting circuit 21 and the voltage detecting circuits 11 and 12, the current detecting circuits 22 to 24 and the voltage detecting circuits 13 to 15 have a similar configuration and a similar operation is performed.

A current source 25 and a detecting circuit 26 of the inside of the voltage detecting circuit 11 and a current source 27 and a detecting circuit 28 of the inside of the voltage detecting circuit 12 are respectively connected to the current detecting circuit 21 as shown in FIG. 2.

The current source 25 is a current source for passing a predetermined current through the resistor Rtest1, and is connected to the resistor Rtest1 of the current detecting circuit 21. The current source 25 uses a voltage between both ends of the block B1 as a power source, and generates a voltage of −V1 volt (Vep−V1) based on a potential (Vep) of the upper end of the block B1. The current source 27 is a current source for passing a predetermined current through the resistor Rtest2, and is connected to the resistor Rtest2 of the current detecting circuit 21. The current source 27 uses a voltage between both ends of the block B2 as a power source, and generates a voltage of +V2 volt (Vep+V2) based on a potential (Vep) of the lower end of the block B2.

The detecting circuits 26, 28 detect voltages between both ends of the resistor Rtest1 and the resistor Rtest2, respectively.

Also, a switch SW1 is disposed between the current source 25 and the current detecting circuit 21. Switches SW2, SW3 are disposed between both ends of the resistor Rtest1 of the current detecting circuit 21 and the detecting circuit 26. A switch SW6 is disposed between the current source 27 and the current detecting circuit 21. Switches SW4, SW5 are disposed between both ends of the resistor Rtest2 of the current detecting circuit 21 and the detecting circuit 28, respectively. In these switches, closing control is performed at the time of correction operation of the voltage detecting circuits 11, 12 using the current detecting circuit 21.

In the embodiment, the detecting circuits 26, 28 detect voltages between both ends of the resistor Rtest1 and the resistor Rtest2 by a flying capacitor method. The flying capacitor method is a well-known method in which, for example, for the detecting circuit 26, closing control of the switches SW2, SW3 is performed and a voltage of the resistor Rtest1 is charged into a capacitor (that is, a flying capacitor) of a state of being floated from a ground incorporated into the detecting circuit 26 and opening control of the switches SW2, SW3 is performed and then a voltage between both ends of the capacitor is detected. By being detected by the flying capacitor method, conversion into a voltage based on a ground potential can be made. Also, in addition to the flying capacitor method, a differential method using an operational amplifier may be adopted.

Voltage values detected by the detecting circuit 26 and the detecting circuit 28 are outputted to the main microcomputer 30 through the bus line BLt for sending and a daisy chain. Next, similarly in each of the voltage detecting circuits 12, 13 and the current detecting circuit 22, the voltage detecting circuits 13, 14 and the current detecting circuit 23, and the voltage detecting circuits 14, 15 and the current detecting circuit 24, voltages between both ends of the resistor Rtest1 and the resistor Rtest2 are detected and voltage values detected are outputted to the main microcomputer 30.

When a current flowing through the current detecting circuit 21 is set at I1 in the circuit shown in FIG. 2, I1 is obtained by the following formula:

$$I1 = ((Vep+V2)-(Vep-V1))/(Rtest1+Rsub1+Rtest2) \quad (1)$$

Therefore, voltages to be detected by the detecting circuits 26, 28 are respectively obtained by the following formulas:

$$\text{Voltage to be detected by the detecting circuit } 26 = Rtest1 \times I1 \quad (2)$$

$$\text{Voltage to be detected by the detecting circuit } 28 = Rtest2 \times I1 \quad (3)$$

A current I1 flowing out of the current source 27 is equal to a current I1 flowing into the current source 25 and also the resistor Rtest1 and the resistor Rtest2 have the same resistance value, so that the voltages detected by the detecting circuits 26, 28 should become the same voltage, but may vary depending on accuracy of a reference voltage. Hence, in the main microcomputer 30, voltages between both ends of the resistors Rtest1, Rtest2 of the current detecting circuits 21 to 24 are corrected based on the detected voltage values.

In a correction method, first, based on a voltage value between both ends of a resistor of the inside of the current detecting circuit 22 detected by the voltage detecting circuit 13 connected to the high-accuracy reference power source 52, a voltage value of the block B2 detected by the voltage detecting circuit 12 is corrected using a difference of the voltage value between both ends with a voltage value between both ends of a resistor of the inside of the current detecting circuit 22 detected by the voltage detecting circuit 12 as an error of a measurement system of the voltage detecting circuit 12. Similarly, based on a voltage value between both ends of a resistor of the inside of the current detecting circuit 23 detected by the voltage detecting circuit 13, a voltage value of the block B4 detected by the voltage detecting circuit 14 is corrected using a difference of the voltage value between both ends with a voltage value between both ends of a resistor of the inside of the current detecting circuit 23 detected by the voltage detecting circuit 14 as an error of a measurement system of the voltage detecting circuit 14. That is, detection results of the voltage detecting circuits connected to the other reference power sources 51 are corrected based on a detection result of the voltage detecting circuit 13 connected to the high-accuracy reference power source 52.

Next, a voltage value between both ends of a resistor detected by the current detecting circuit 21 is corrected based on the corrected voltage value between both ends of a resistor of the current detecting circuit 22 detected by the voltage detecting circuit 12, and based on the corrected voltage value between both ends of a resistor of the current detecting circuit 21 detected by the voltage detecting circuit 12, a voltage value of the block B1 detected by the voltage detecting circuit 11 is corrected using a difference of the voltage value between both ends with a voltage value between both ends of a resistor of the current detecting circuit 21 detected by the voltage detecting circuit 11 as an error of a measurement system of the voltage detecting circuit 11. Similarly, a voltage value between both ends of a resistor detected by the current detecting circuit 24 is corrected based on the corrected voltage value between both ends of a resistor of the current detecting circuit 23 detected by the voltage detecting circuit 14, and based on the corrected voltage value between both ends of a resistor of the current detecting circuit 24 detected by the voltage detecting circuit 14, a voltage value of the block B5 detected by the voltage detecting circuit 15 is corrected using a difference of the voltage value between both ends with a voltage value between both ends of a resistor of the current detecting circuit 24 detected by the voltage detecting circuit 15 as an error of a measurement system of the voltage detecting circuit 15. That is, based on a detection result of one voltage detecting circuit of the adjacent voltage detecting circuits, a detection result of the other voltage detecting circuit is corrected.

According to the voltage detecting apparatus described above, the reference power source 52 with higher accuracy than the other reference power sources 51 among the reference power sources disposed in the voltage detecting circuits 11 to 15 is disposed in the voltage detecting circuit 13 and detected voltages of the other voltage detecting circuits 11, 12, 14, 15 are corrected based on the voltage detecting circuit 13. Thus, detection results of the voltage detecting circuits 11, 12, 14, 15 connected to the other reference power sources 51 can be corrected based on a detection result with a small error by the voltage detecting circuit 13 connected to the high-accuracy reference power source 52, and errors of the detection results of the voltage detecting circuits can be corrected surely with high accuracy.

Also, the other voltage detecting circuit 11 is corrected based on the voltage detecting circuit 12 corrected based on the voltage detecting circuit 13 connected to the high-accuracy reference power source 52 among the adjacent voltage detecting circuits 11, 12, so that a correction based on the high-accuracy reference power source can be made indirectly.

Also, the high-accuracy reference power source 52 is disposed in correspondence with the voltage detecting circuit 13 corresponding to the centrally positioned block B3 of the plural blocks B1 to B5. Thus, the number of corrections to the voltage detecting circuit 11 or 15 corresponding to the block of both ends becomes smaller than the case of disposing the reference power source of the voltage detecting circuit 11 or 15 corresponding to the block B1 or B5 of one end with high accuracy.

Also, the current source 25 or 27 and the detecting circuit 26 or 28 are disposed in the voltage detecting circuits 11 to 15 and the resistor Rtest1, the resistor Rtest2 and the resistor Rsub1 with the same resistance value are connected between the current source 25 and the current source 27. A voltage between both ends of the resistor Rtest1 is detected by the detecting circuit 26, and a voltage between both ends of the resistor Rtest2 is detected by the detecting circuit 28. A correction is made based on both of detection results, so that a circuit for correction can be constructed at low cost.

Figure 3:
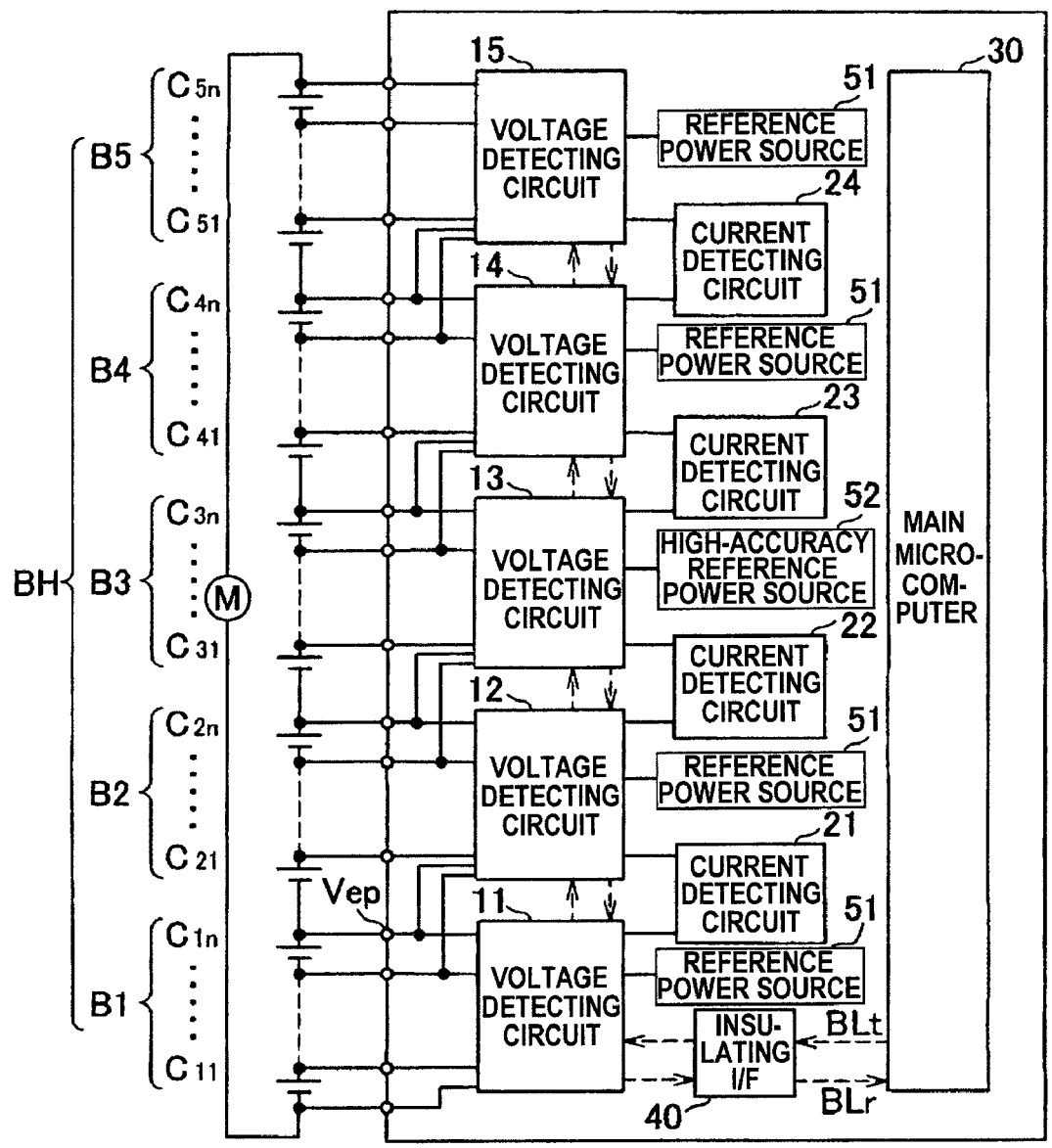
FIG. 3 is a circuit diagram showing another embodiment of the invention.

In addition, in the embodiment described above, an error between the adjacent voltage detecting circuits is detected using the current detecting circuits 21 to 24, but the embodiment is not limited to that. Alternatively, the following method may be used. That is, for example, as shown in FIG. 3, voltages of unit cells (C1n, C2n, C3n, C4n in FIG. 3, but may be C21, C31, C41, C51) present in boundaries among the adjacent blocks are constructed so as to be able to be detected in common by the adjacent voltage detecting circuits and values detected by the voltage detecting circuits 12 and 14 are corrected based on a value detected by the voltage detecting circuit 13 and the voltage detecting circuits 11 and 15 are corrected based on the corrected values of the voltage detecting circuits 12 and 14. In other words, the error between the adjacent voltage detecting circuits could be detected by measuring a unit cell or a circuit having a common condition between the adjacent voltage detecting circuits.

Also, the high-accuracy reference power source 52 may be disposed in plural (two or more) voltage detecting circuits rather than one voltage detecting circuit. When the high-accuracy reference power source 52 is disposed in the plural voltage detecting circuits, a correction between the plural high-accuracy reference power sources 52 is made based on the reference power source with the highest accuracy. When the plural high-accuracy reference power sources 52 have the same characteristics, the standard reference power source could be selected arbitrarily.

In addition, the embodiment described above only shows a typical form of the invention, and the invention is not limited to the embodiment. That is, the invention can be variously modified and implemented without departing from the gist of the invention.

What is claimed is:

1. A voltage detection apparatus, comprising:
a battery including a plurality of unit cells mutually connected in series;
a plurality of blocks, each block including at least one of the plurality of unit cells;
a plurality of voltage detectors, each detector connected to respective one of the blocks, and detecting a voltage between both ends of the unit cell in the one of the blocks;
a plurality of reference power sources, each source connected to respective one of the voltage detectors, and at least one of the reference power sources having higher accuracy than the other reference power sources;
a plurality of current detecting circuits; each of the current detecting circuits connected to at least two adjacent voltage detectors, wherein each of the current detecting circuits comprises a first current detecting element, a second current detecting element, and a voltage regulating element connected between the first current detecting element and the second current detecting element, the first and the second current detecting elements receiving currents from the at least two voltage detectors to which they are connected to detect a voltage between both ends of the first current detecting element and a voltage between both ends of the second current detecting element; and
a correcting unit which corrects a detection result of the voltage detector which is connected to the other reference power source on the basis of a detection result of the voltage detector which is connected to the reference power source with the higher accuracy.

2. The voltage detection apparatus according to claim 1, wherein the correcting unit corrects a detection result of one of mutually-adjacent voltage detectors on the basis of a detection result of the other of the mutually-adjacent voltage detectors.

3. The voltage detection apparatus according to claim 1, wherein the reference power source with the higher accuracy is connected to one of the voltage detectors which is connected to a centrally-positioned block of the plurality of blocks.

4. The voltage detection apparatus according to claim 2, wherein each of the voltage detectors detects a voltage between both ends of the unit cell in adjacent one of the blocks, and wherein the correcting unit corrects the detection result of the one of the mutually-adjacent voltage detectors on the basis of the detection result of the other of the mutually-adjacent voltage detectors using a common unit cell among the plurality of the unit cells.

5. The voltage detection apparatus according to claim 1, wherein the each of the current detecting circuits detects a difference between the voltage between both ends of the first current detecting element and the voltage between both ends of the second current detecting element, and the correcting unit corrects a value of the voltage detected by the voltage detector which is connected to the other reference power source by using the difference detected by the current detecting circuit connected to the voltage detector to which the reference power source with the higher accuracy is connected and the voltage detector to which the other reference power source is connected.

* * * * *